United States Patent
Otremba et al.

(10) Patent No.: US 8,227,908 B2
(45) Date of Patent: Jul. 24, 2012

(54) ELECTRONIC DEVICE HAVING CONTACT ELEMENTS WITH A SPECIFIED CROSS SECTION AND MANUFACTURING THEREOF

(75) Inventors: Ralf Otremba, Kaufbeuren (DE); Josef Hoeglauer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 12/168,254

(22) Filed: Jul. 7, 2008

(65) Prior Publication Data
US 2010/0001291 A1 Jan. 7, 2010

(51) Int. Cl.
*H01L 23/48* (2006.01)
*H01L 23/52* (2006.01)
*H01L 29/40* (2006.01)

(52) U.S. Cl. ........ 257/692; 257/690; 257/691; 257/730; 257/779; 257/E23.079

(58) Field of Classification Search .................. 257/691, 257/693, 696, 690, 692, 77, 667, E23.031, 257/E21.15, 698, 730, 772, 773, 779, E23.079
See application file for complete search history.

(56) References Cited

U.S. PATENT DOCUMENTS

| | | | |
|---|---|---|---|
| 4,862,344 A | 8/1989 | Emoto | |
| 5,581,118 A | 12/1996 | Mays | |
| 5,723,900 A * | 3/1998 | Kojima et al. | 257/666 |
| 5,767,579 A * | 6/1998 | Kanazawa et al. | 257/717 |
| 6,291,880 B1 | 9/2001 | Ogawa et al. | |
| 6,433,418 B1 * | 8/2002 | Fujisawa et al. | 257/696 |
| 6,611,052 B2 * | 8/2003 | Poo et al. | 257/686 |
| 6,710,439 B2 * | 3/2004 | Lee et al. | 257/691 |
| 6,787,700 B2 * | 9/2004 | Nagao et al. | 174/541 |
| 6,791,172 B2 * | 9/2004 | Chen et al. | 257/678 |
| 6,794,742 B2 | 9/2004 | Kawafuji et al. | |
| 6,818,971 B2 | 11/2004 | Oda et al. | |
| 6,841,866 B2 * | 1/2005 | Arai et al. | 257/702 |
| 6,876,066 B2 * | 4/2005 | Fee et al. | 257/666 |
| 7,148,554 B2 * | 12/2006 | Nah et al. | 257/532 |
| 7,166,919 B2 | 1/2007 | Tabira | |
| 7,173,333 B2 | 2/2007 | Hata et al. | |
| 7,208,818 B2 | 4/2007 | Luo et al. | |
| 7,285,849 B2 | 10/2007 | Cruz et al. | |
| 7,368,810 B2 * | 5/2008 | Seng et al. | 257/684 |
| 7,893,545 B2 * | 2/2011 | Otremba | 257/781 |
| 2001/0000053 A1 * | 3/2001 | Suh et al. | 257/686 |
| 2003/0075796 A1 | 4/2003 | Hata et al. | |
| 2004/0007772 A1 * | 1/2004 | Arai et al. | 257/691 |
| 2004/0145043 A1 * | 7/2004 | Hayashi et al. | 257/696 |
| 2004/0227544 A1 | 11/2004 | Yin | |

(Continued)

FOREIGN PATENT DOCUMENTS
DE 102005004160 A1 8/2006

*Primary Examiner* — Teresa M Arroyo
(74) *Attorney, Agent, or Firm* — Dicke, Billig & Czaja, PLLC

(57) ABSTRACT

An electronic device and manufacturing thereof. One embodiment provides a carrier and multiple contact elements. The carrier defines a first plane. A power semiconductor chip is attached to the carrier. A body is formed of an electrically insulating material covering the power semiconductor chip. The body defines a second plane parallel to the first plane and side faces extends from the first plane to the second plane. At least one of the multiple contact elements has a cross section in a direction orthogonal to the first plane that is longer than 60% of the distance between the first plane and the second plane.

16 Claims, 15 Drawing Sheets

U.S. PATENT DOCUMENTS

| | | |
|---|---|---|
| 2004/0227547 A1 | 11/2004 | Shiraishi et al. |
| 2005/0093177 A1* | 5/2005 | Liu .............................. 257/786 |
| 2005/0127494 A1* | 6/2005 | Liu .............................. 257/696 |
| 2006/0175688 A1* | 8/2006 | Jang ............................. 257/666 |
| 2006/0197187 A1 | 9/2006 | Lohninger et al. |
| 2007/0257343 A1* | 11/2007 | Hauenstein et al. .......... 257/676 |
| 2008/0157302 A1* | 7/2008 | Lee et al. ...................... 257/676 |
| 2009/0020861 A1* | 1/2009 | Otremba ....................... 257/676 |

* cited by examiner

FIG 3C
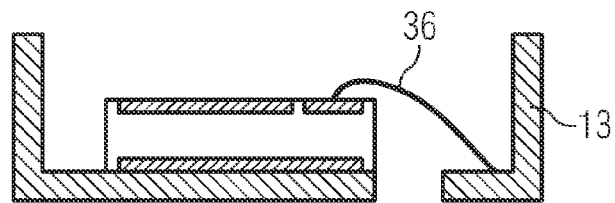
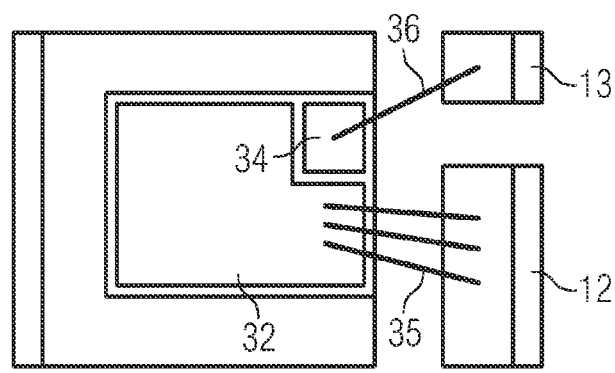
FIG 3D
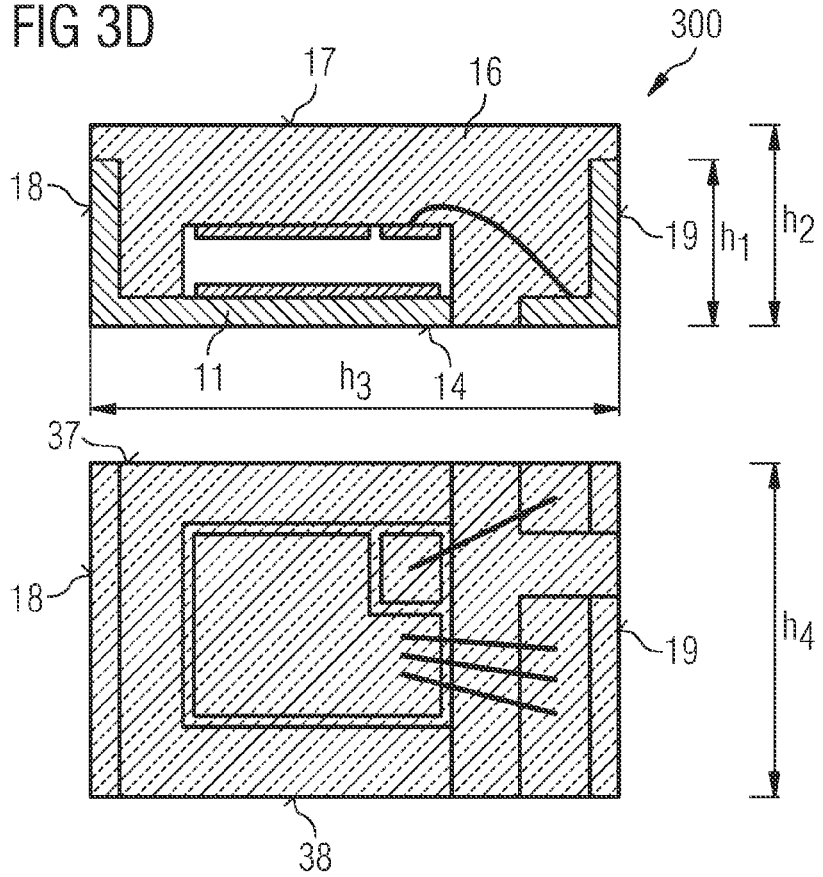

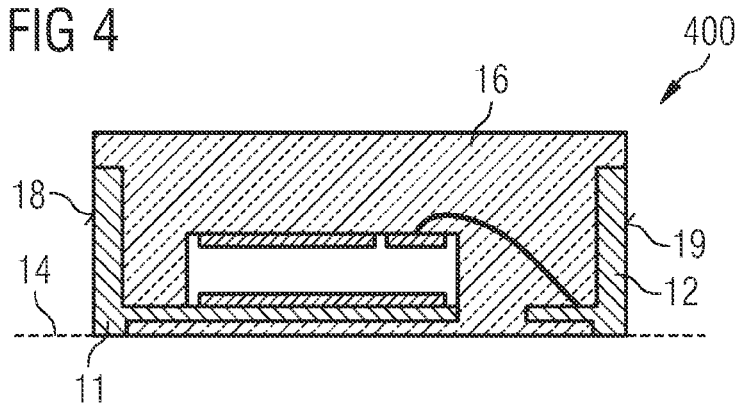
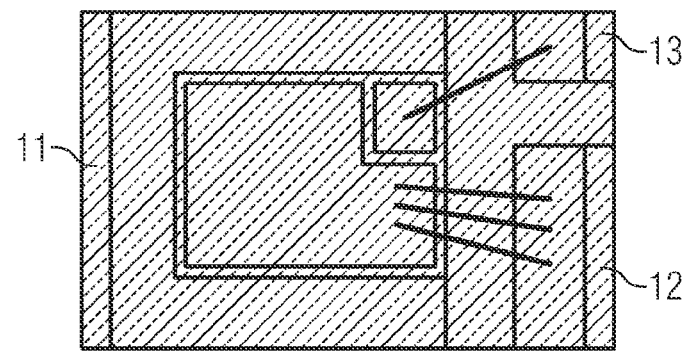
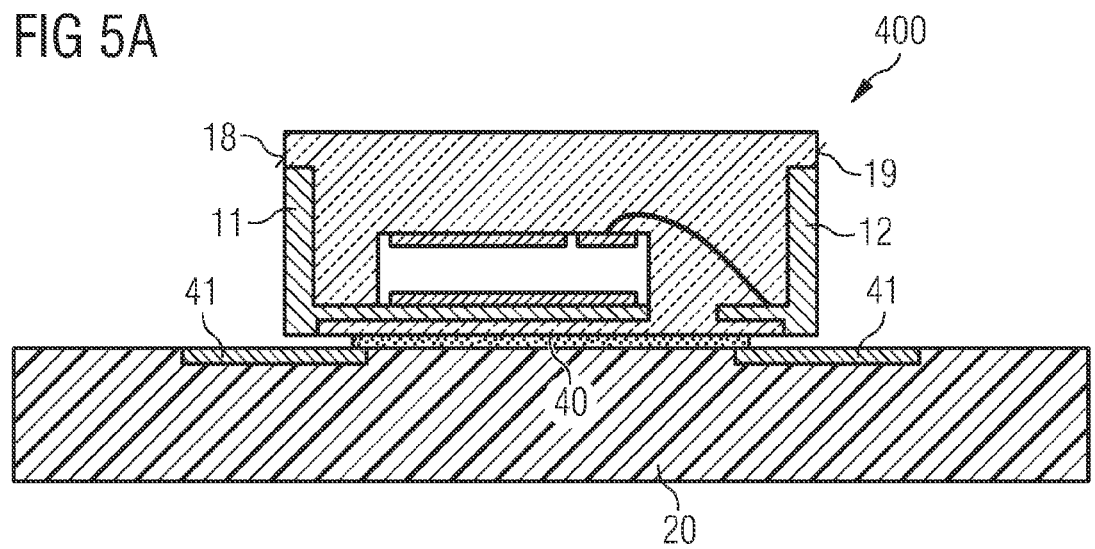

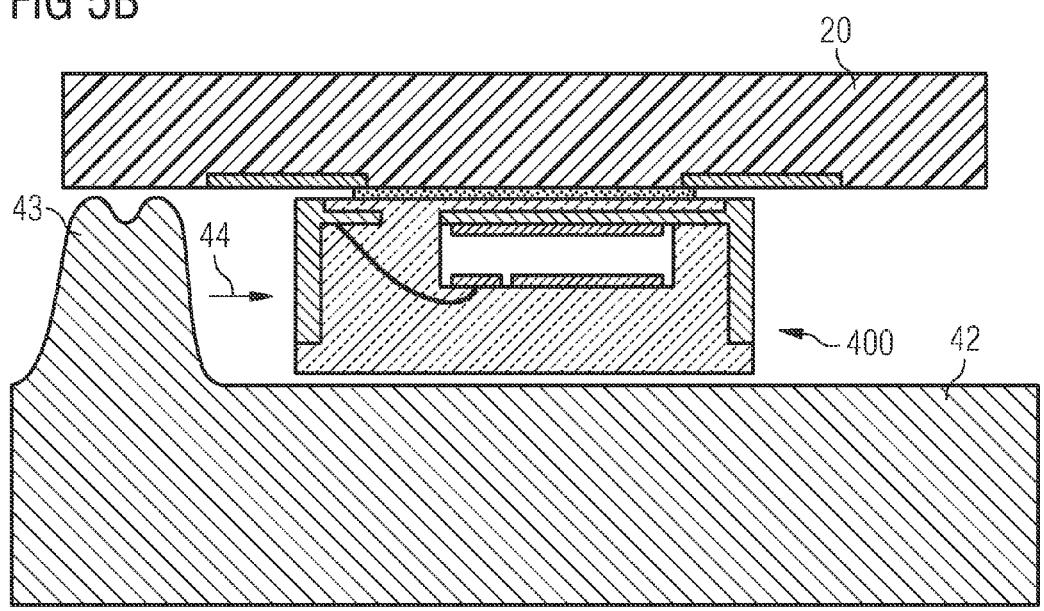
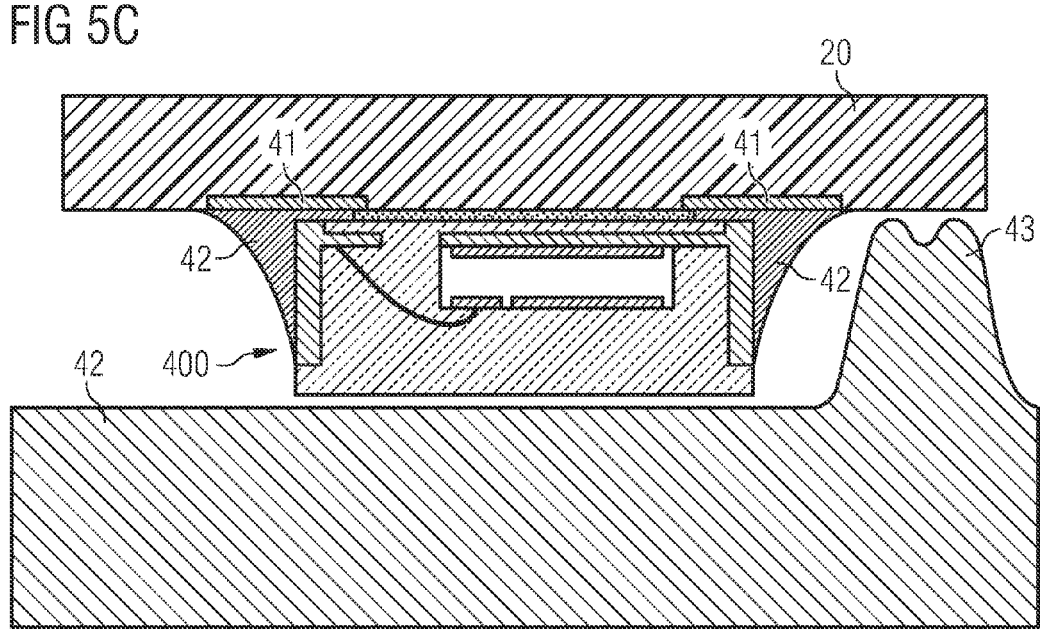

FIG 7C
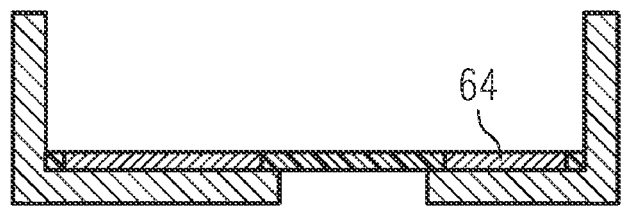
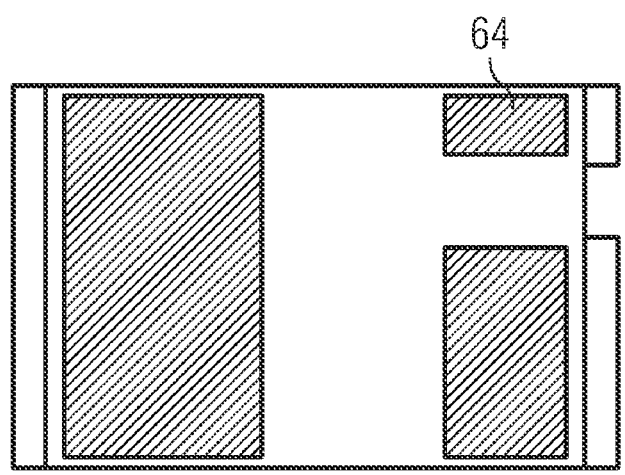
FIG 7D
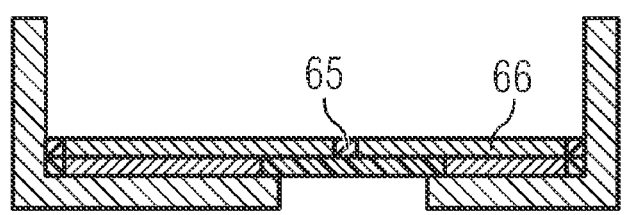
FIG 7E
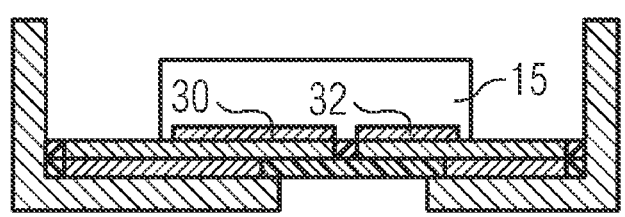

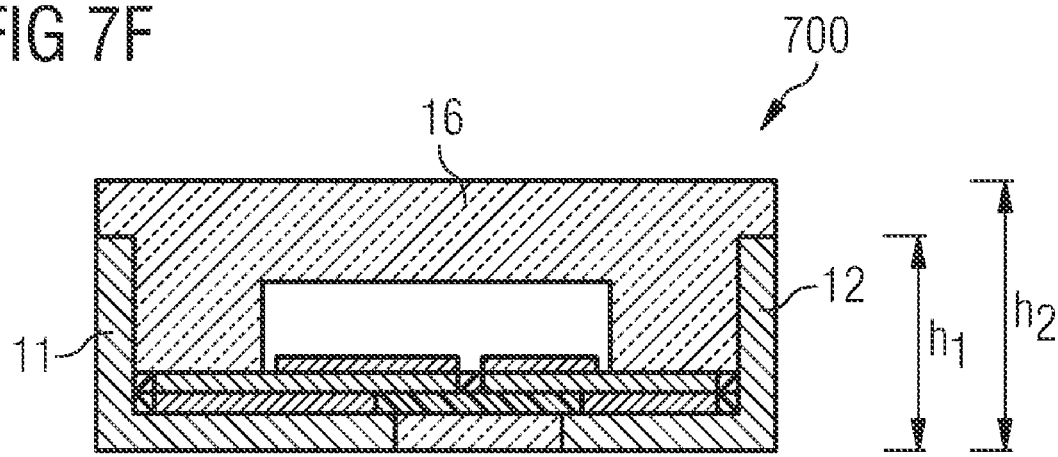
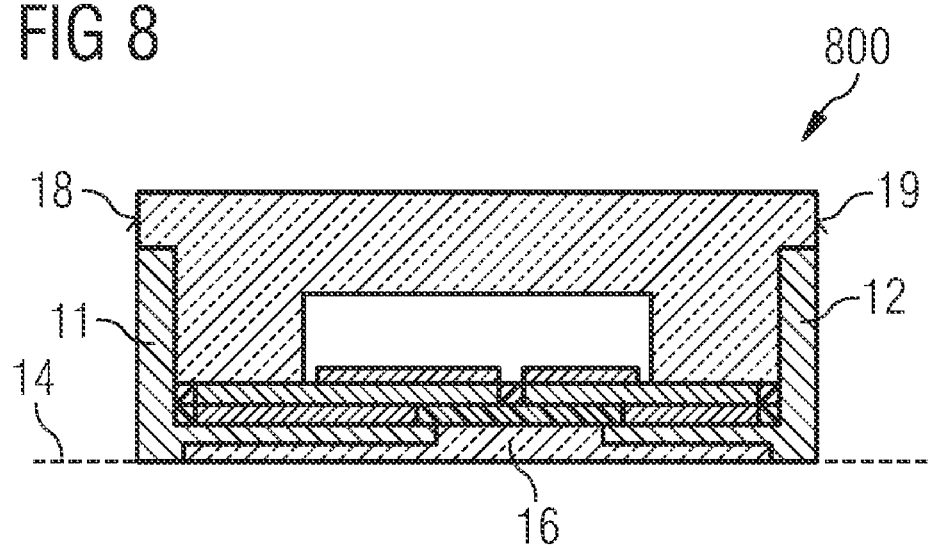

FIG 9C
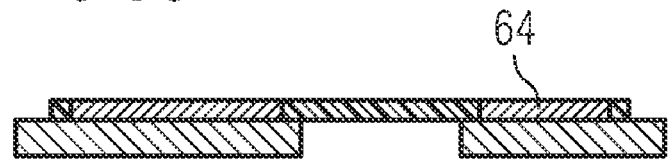
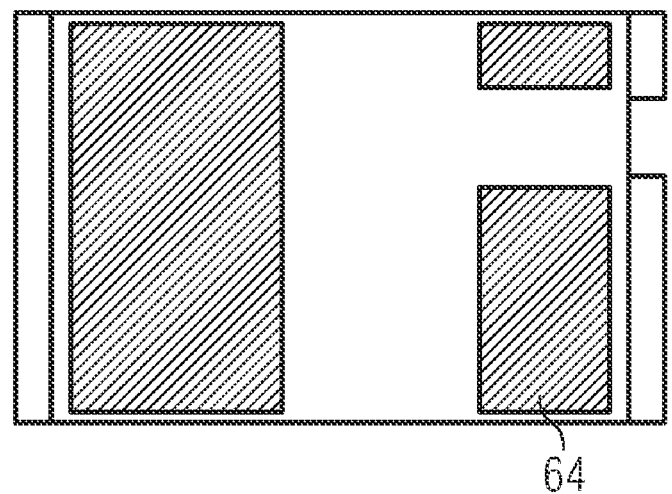
FIG 9D
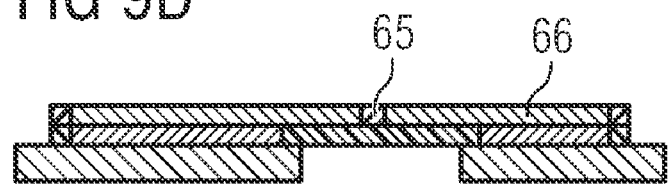
FIG 9E
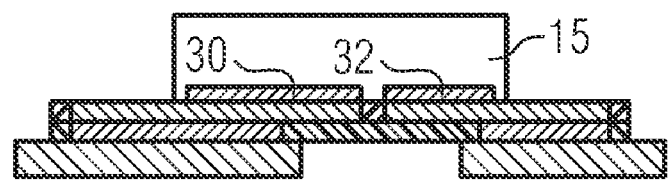

ELECTRONIC DEVICE HAVING CONTACT ELEMENTS WITH A SPECIFIED CROSS SECTION AND MANUFACTURING THEREOF

BACKGROUND

This invention relates to an electronic device and a method of manufacturing thereof.

Power semiconductor chips may, for example, be integrated into electronic devices. Power semiconductor chips are suitable, in one embodiment, for the switching or control of currents and/or voltages. Power semiconductor chips may, for example, be implemented as power MOSFETs, IGBTs, JFETs, power bipolar transistors or power diodes.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A to 3D schematically illustrate one embodiment of a method to produce a device.

FIG. 4 schematically illustrates one embodiment of a device.

FIGS. 5A to 5C schematically illustrate one embodiment of a method to mount the device on a circuit board.

FIGS. 7A to 7F schematically illustrate one embodiment of a method to produce a device.

FIG. 8 schematically illustrates one embodiment of a device.

FIGS. 9A to 9H schematically illustrate one embodiment of a method to produce a device.

DETAILED DESCRIPTION

Figure 1:
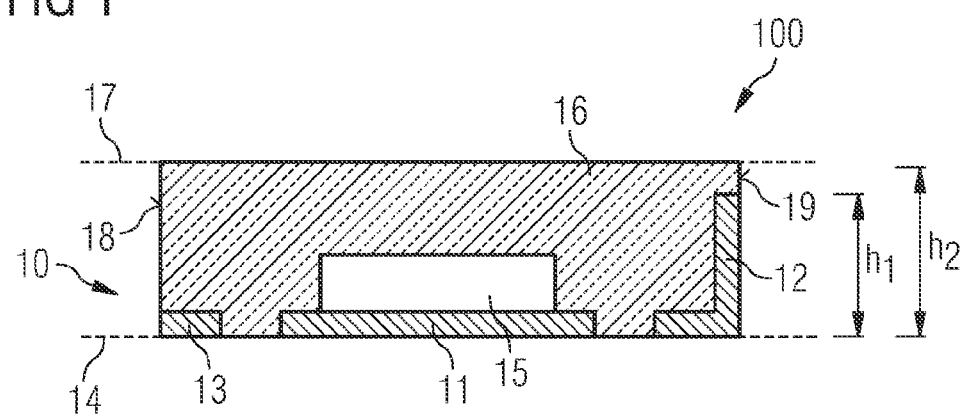
FIG. 1 schematically illustrates one embodiment of a device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing,"etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The devices described below may include one or more semiconductor chips. The semiconductor chips may be of different types and may include for example integrated electrical or electro-optical circuits. Some of the semiconductor chips may, for example, be configured as power semiconductor chips, such as power diodes, power MOSFETs (Metal Oxide Semiconductor Field Effect Transistors), IGBTs (Insulated Gate Bipolar Transistors), JFETs (Junction Gate Field Effect Transistors) or power bipolar transistors. Furthermore, the semiconductor chips may include control circuits, driver circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in one embodiment on its two main surfaces, that is to say on its top side and bottom side. In one embodiment, power semiconductor chips may have a vertical structure. By way of example, the source electrode and gate electrode of a power MOSFET and the anode electrode of a power diode may be situated on one main surface, while the drain electrode of the power MOSFET and the cathode electrode of the power diode are arranged on the other main surface. A power diode may be embodied in one embodiment as a Schottky diode. Furthermore, the devices described below may include integrated circuits to control and/or drive the integrated circuits of other semiconductor chips, for example, the integrated circuits of power transistors or power diodes. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The semiconductor chips may be placed on carriers. The carriers may be of any shape, size and material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in one embodiment copper, copper alloys, iron nickel, aluminum, aluminum alloys, or other appropriate materials. The carriers may be, for example, a leadframe or a part of a leadframe. Furthermore, the carriers may be plated with an electrically conductive material, for example copper, silver, iron nickel or nickel phosphorus.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conducting organic material. The external contact elements may, for example, be leads of a leadframe, solder balls, solder bumps or contact elements of leadless packages.

The semiconductor chips or at least parts of the semiconductor chips may be covered with an electrically insulating material. The electrically insulating material may be any appropriate laminate (prepreg), duroplastic, thermoplastic or thermosetting material and may contain filler materials. Various techniques may be employed to cover the semiconductor chips with the electrically insulating material, for example lamination, compression molding, injection molding, powder molding or liquid molding. The electrically insulating material may be used to form bodies containing one or more semiconductor chips or passives.

FIG. 1 schematically illustrates one embodiment of a device 100 in cross section. The device 100 includes a carrier 11 and contact elements 12 and 13. The carrier 11 defines a first plane 14. In the present embodiment, the first plane 14 is defined by the bottom face of the carrier 11. The carrier 11 and the contact elements 12 and 13 may be part of a leadframe 10. A power semiconductor chip 15 is attached to the carrier 11. A body 16 formed of an electrically insulating material covers the power semiconductor chip 15. The body 16 defines a second plane 17 parallel to the first plane 14. In the present embodiment, the second plane 17 is defined by the top face of the body 16. The body 16 further defines side faces 18 and 19 which extend from the first plane 14 to the second plane 17. At least the contact element 12 has a cross section in a direction orthogonal to the first plane 14 that is longer than 60% of the distance between the first plane 14 and the second plane 17. In the present embodiment, the contact element 12 has a portion extending orthogonal to the first plane 14. This portion of the contact element 12 has a height $h_1$ which is longer than 60% of the height $h_2$ of the side face 19 of the device 100. In one embodiment, the height $h_1$ may be longer than 70, 80 or 90% of the height $h_2$.

Figure 2:
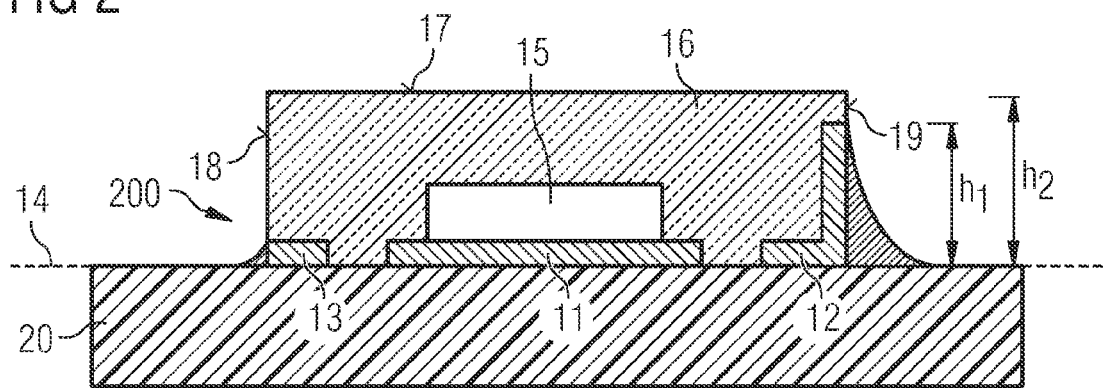
FIG. 2 schematically illustrates one embodiment of a method to mount a device on a circuit board.

As schematically illustrated in FIG. 2, a device 200 may be mounted on a circuit board 20, for example a PCB (Printed Circuit Board). The device 200 may be electrically coupled to the circuit board 20 by wave soldering. The device 200 may be similar to the device 100 and may include a carrier 11, contact elements 12 and 13, a power semiconductor chip 15 mounted on the carrier 11, and a body 16 formed of an electrically insulating material covering the power semiconductor chip 15. In contrast to the device 100, the height $h_1$ of the portion of the contact element 12 extending orthogonal to the first plane 14 is at least longer than 30% of the height $h_2$ of the side face 19 of the device 200. In one embodiment, the height $h_1$ may be longer than 40, 50, 60, 70, 80 or 90% of the height $h_2$.

Figure 3A:
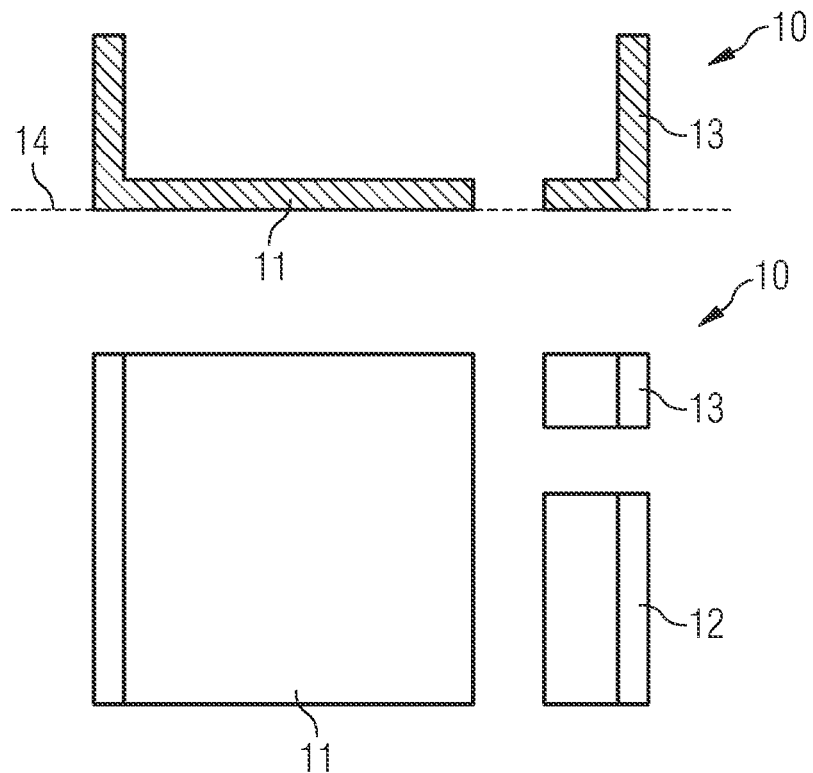

FIGS. 3A to 3D schematically illustrate one embodiment of a method for production of a device 300, a cross section of which is illustrated in FIG. 3D. The device 300 illustrated in FIG. 3D is an implementation of the devices 100 and 200 illustrated in FIGS. 1 and 2. The details of the device 300 that are described below can therefore be likewise applied to the devices 100 and 200.

In FIG. 3A the leadframe 10, which is used to manufacture the device 300, is illustrated in side view (top) and top view (bottom). The leadframe 10 includes the carrier 11 and the contact elements 12 and 13. Each of the carrier 11 and the contact elements 12 and 13 have a portion extending parallel to the first plane 14 and a portion extending orthogonal to the first plane 14. The carrier 11 and the contact elements 12 and 13 may have any geometric shapes and may be arranged in any way. The leadframe 10 may be manufactured from a metal, for example copper, or a metal alloy, for example iron nickel. The leadframe 10 may be plated with an electrically conductive material, for example copper, silver, iron nickel or nickel phosphorus. The leadframe 10 may have been stamped or milled in order to generate the outer shape of the leadframe 10 as illustrated in FIG. 3A. In one embodiment, the ends of the carrier 11 and the contact elements 12 and 13 may have been bent upwardly to obtain the shape of the leadframe 10.

Figure 3B:
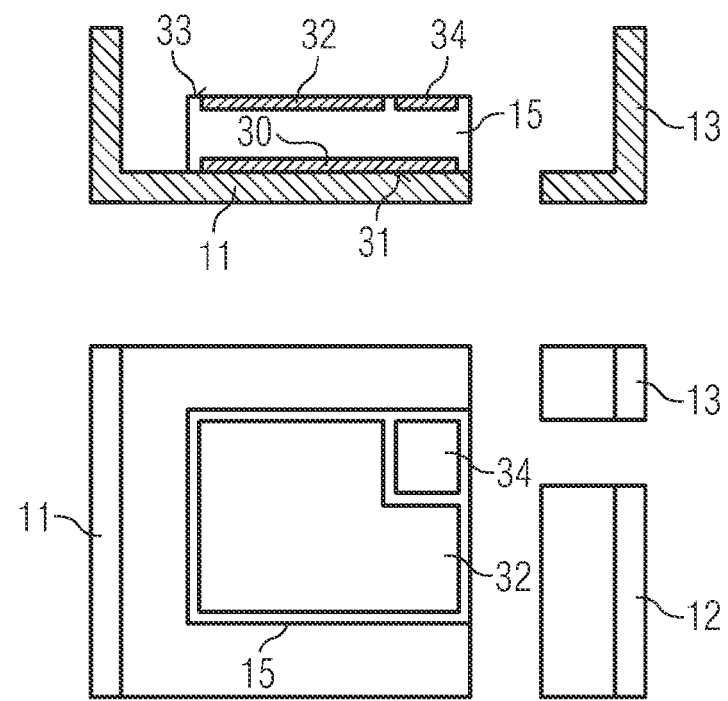

The power semiconductor chip 15 as well as possibly further semiconductor chips are placed over the portion of the carrier 11 extending parallel to the first plane 14 (see FIG. 3B). The power semiconductor chip 15 may have a first electrode 30 on a first main surface 31 and a second electrode 32 on a second main surface 33 that is opposite to the first main surface 31. The power semiconductor chip 15 may, for example, be a power diode or a power transistor, such as a power MOSFET, an IGBT, a JFET or a power bipolar transistor. In the case of a power MOSFET, which is exemplarily illustrated in FIG. 3B, the first and second electrodes 30 and 32 may be drain and source electrodes, respectively. Furthermore, the power semiconductor chip 15 may have a third electrode 34 on the second main surface 33 functioning as a gate terminal in the case the first power semiconductor chip 15 is a power MOSFET. The power semiconductor chip 15 may be mounted onto the carrier 11 with its first main surface 31 facing the carrier 11. The drain electrode 30 may be electrically connected to the carrier 11.

The electrical connection between the drain electrode 30 of the power semiconductor chip 15 and the carrier 11 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the carrier 11 and the power semiconductor chip 15 on account of interface diffusion processes. In this case, the use of Sn, AuSn, AgSn, CuSn, AgIn, AuIn, CuIn, AuSi or Au solders is conceivable. If the power semiconductor chip 15 is adhesively bonded to the carrier 11, it is possible to use electrically conductive adhesives which may be based on epoxy resins and be enriched with gold, silver, nickel or copper in order to produce the electrical conductivity.

Electrical interconnections between the electrodes 32 and 34 located on the second main surface 33 of the power semiconductor chip 15 and the contact elements 12 and 13 are made by bond wires 35 and 36, respectively (see FIG. 3C).

More than one bond wire 35 may be used to electrically couple the source electrode 32 to the contact element 12. The bond wires 35 and 36 may, for example, be made up of one of gold, copper and aluminum. Ball bonding, wedge bonding or any other suitable bonding technique may be employed to attach the bond wires 35 and 36 at both ends.

The power semiconductor chip 15 may be encapsulated by a mold material 16 (see FIG. 3D). For example, a duroplastic or thermosetting mold material 16 may be used. The mold material 16 may be based on an epoxy material and may contain a filling material consisting of small particles of glass or other electrically insulating mineral filler material like $Al_2O_3$ or organic filler material.

The device 300 as illustrated in FIG. 3D is a leadless package and may have essentially the form of a cuboid. The second plane 17, which is parallel to the first plane 14, is defined by the top surface of the mold material 16. The device 300 has side faces 18, 19, 37 and 38, which extend from the first plane 14 to the second plane 17. A surface of the carrier 11 may be exposed at the side face 18, and surfaces of the contact elements 12 and 13 may be exposed at the side face 19. The exposed surfaces of the carrier 11 and the contact elements 12 and 13 may function as external contact elements which are accessible from outside the device 300 and allow electrical contact to be made with the drain electrode 30, the source electrode 32 and the gate electrode 34 from outside the device 300, respectively.

In the present embodiment, the portions of the carrier 11 and the contact elements 12 and 13 extending orthogonal to the first plane 14 have the same height $h_1$. It may in one embodiment be provided that these portions of the carrier 11 and the contact elements 12 and 13 have different heights, however their heights $h_1$ are at least 30, 40, 50, 60, 70, 80 or 90% of the height $h_2$ of the device 300, which is the distance between the first plane 14 and the second plane 17.

It may be provided that the distance $h_3$ between the side faces 18 and 19 is greater than the distance $h_4$ between the side faces 37 and 38. This means that the external contact elements of the drain electrode 30 and the source electrode 32, which are exposed at the side surfaces 18 and 19, have the maximum possible distance within the device 300. During operation of the device 300, voltages higher than 50, 100, 500 or 1000 V may be applied between the drain and source electrodes 30 and 32. The large distance between the external contact elements of the drain electrode 30 and the source electrode 32 reduces creepage currents between these electrodes and may increase electrical strength of the device 300. The external contact element of the gate electrode 34 may be arranged on the same side face 19 as the external contact element of the source electrode 32, since the voltage between the source electrode 32 and the gate electrode 34 is usually not higher than about 20 V. Each of the surfaces of the carrier 11 and the contact element 12 exposed at the side faces 18 and 19, respectively, may be larger than 0.3 or 0.4 or 0.5 $mm^2$. This allows currents to flow through the load electrodes 30 and 32 of more than 5 or 10 A.

It is obvious to a person skilled in the art that the device 300 illustrated in FIG. 3D and the manufacturing thereof as described above are only intended to be an exemplary embodiment, and many variations are possible. For example, more than one semiconductor chip or passives may be included in the device 300. The semiconductor chips and passives may differ in function, size, manufacturing technology etc.

A variation of the device 300 is illustrated in FIG. 4. In the device 400 as illustrated in FIG. 4, the bottom faces of the carrier 11 and the contact elements 12 and 13 are not completely planar, but they exhibit recesses in certain areas. Only in areas adjacent to the side faces 18 and 19, the bottom faces of the carrier 11 and the contact elements 12 and 13 lie in the first plane 14. The recesses in the bottom face of the leadframe 10 may have been formed by milling, stamping, etching or any other appropriate technique. The recesses may have been filled with the electrically insulating mold material 16. Due to the mold material 16 covering the bottom faces of the carrier 11 and the contact elements 12 and 13, the distance of the external contact elements of the drain electrode 30 and the source electrode 32 measured along the surface of the device 400 is even longer when compared to the device 300, thereby further reducing creepage currents between these electrodes.

The exposed surfaces of the carrier 11 and the contact elements 12 and 13 may be used to electrically couple the device 400 to other components. This is exemplarily illustrated in FIGS. 5A to 5C. There, an excerpt of a circuit board 20, for example a PCB, is illustrated, on which the device 400 is mounted. An adhesive material 40 is used to attach the bottom face of the device 400 to the circuit board (see FIG. 5A). The device 400 is aligned such that the side faces 18 and 19 of the device 400 are placed over contact pads 41 of the circuit board 20.

In the present embodiment, wave soldering is used to electrically couple the device 400 to the circuit board 20, although other solder techniques are also possible. As illustrated in FIG. 5B, the circuit board 20 together with the device 400 are placed over a tank of molten solder material 42 with the device 400 facing downwards. In the tank a wave 43 of solder material 42 is generated, for example by pumping, which can be moved along the circuit board 20 as indicated by an arrow 44 in FIG. 5B. In one embodiment, the circuit board 20 may be passed across the wave 43 of solder material 42.

The solder material 42 wets the exposed contact pads 41 of the circuit board 20 and the adjacent exposed external contact elements of the device 400 (see FIG. 5C), creating a reliable electrical connection between the carrier 11, the contact elements 12 and 13 as well as the contact pads 41.

The technique of wave soldering may also be used to mount the devices 100, 200 and 300 as well as the devices 600, 700, 800, 900 and 1200, which are described further below, to a circuit board.

Figure 6A:
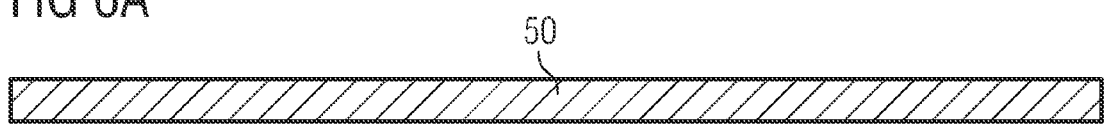
FIGS. 6A to 6J schematically illustrate one embodiment of a method to produce a device.
Figure 6B:
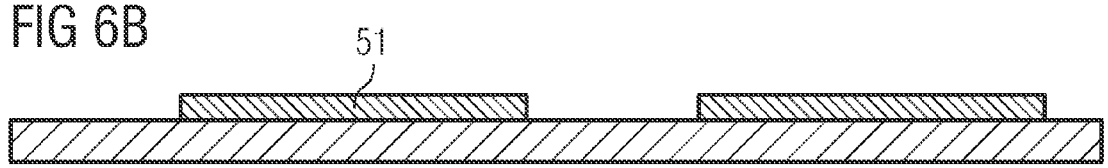
Figure 6C:
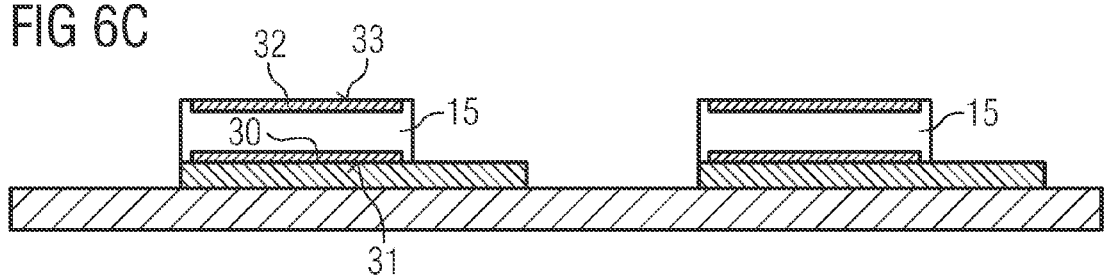
Figure 6D:
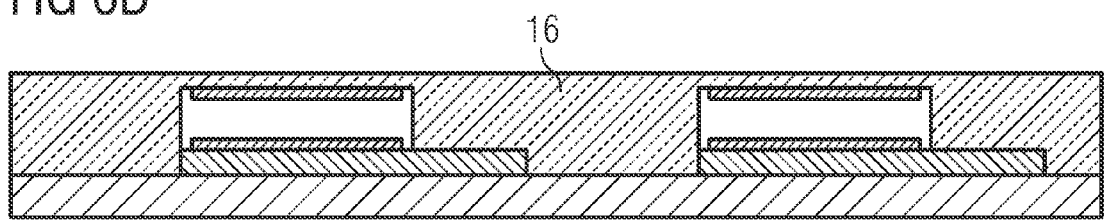
Figure 6E:
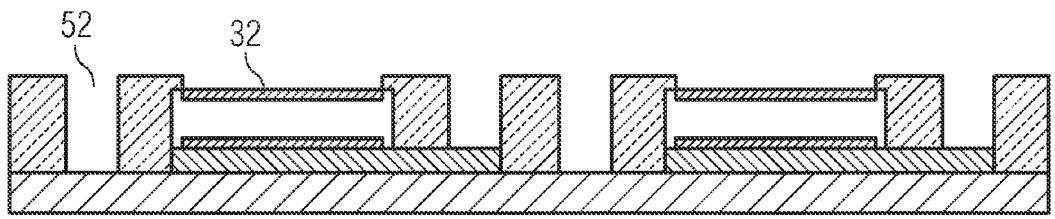
Figure 6F:
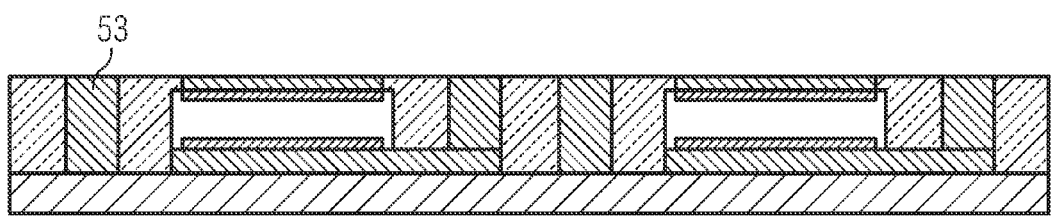
Figure 6G:
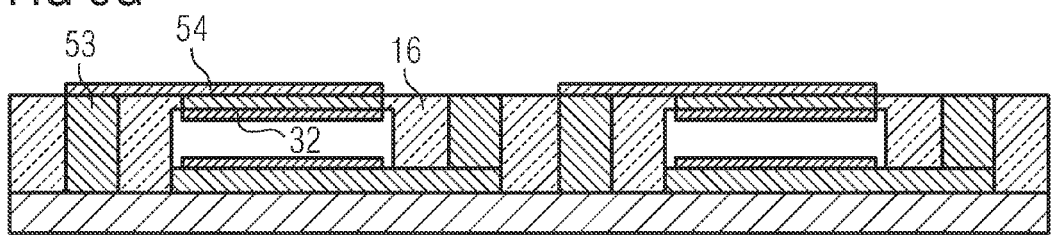
Figure 6H:
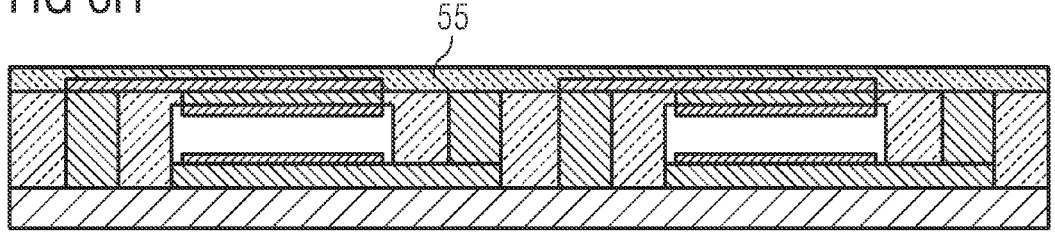
Figure 6I:
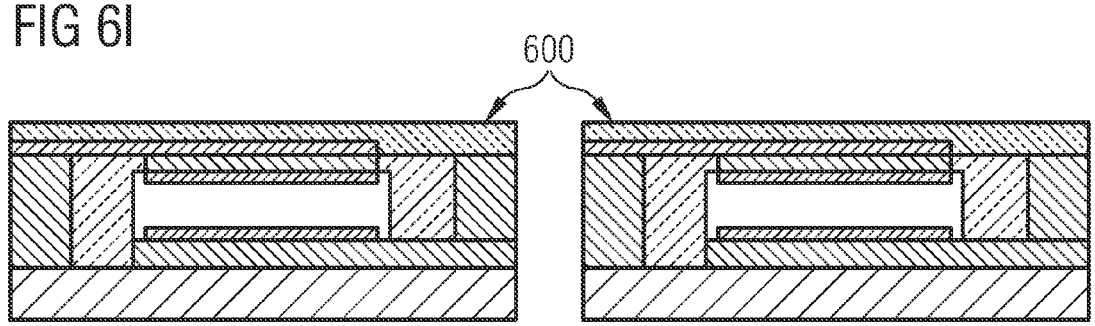
Figure 6J:
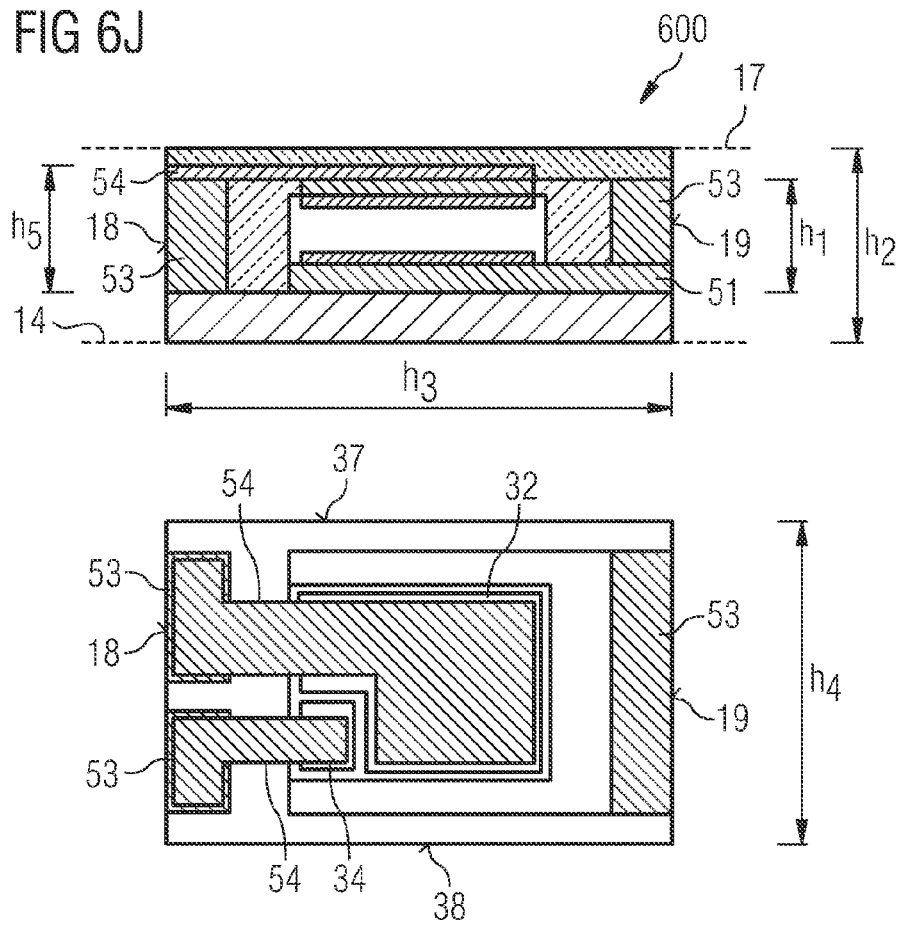

FIGS. 6A to 6J schematically illustrate one embodiment of a method for production of a device 600, a cross section of which is illustrated in FIG. 6J. The device 600 illustrated in FIG. 6J is an implementation of the devices 100 and 200 illustrated in FIGS. 1 and 2. The details of the device 600 that are described below can therefore be likewise applied to the devices 100 and 200.

In FIG. 6A an electrically insulating substrate 50 is provided. The substrate 50 may be a plate made of a rigid material and may have a flat surface on which the components of the device 600 to be fabricated may be placed. The shape of the substrate 50 is not limited to any size or geometric shape, for example the substrate 50 may be round or square-shaped. The substrate 50 may have a thickness in the range from 100 µm to 1 mm or may be even thicker. The electrically insulating substrate 50 may for example be fabricated from a ceramic material, such as $Al_2O_3$ or AlN. In one embodiment, the substrate 50 may consist of organic materials, such as imide, epoxy or duroplast, metal oxides, semiconductor oxides, or diamond-like carbon.

An electrically conductive layer 51 is deposited on the substrate 50 (see FIG. 6B). The electrically conductive layer 51 may have a thickness in the range from 10 to 400 µm, in one embodiment in the range from 80 to 120 µm. The electrically conductive layer 51 may be structured such that only some areas of the substrate 50 are covered by the electrically conductive layer 51. For example, after structuring the electrically conductive layer 51 may consist of an array of electrically conductive pads arranged on the substrate 50 (only two of the pads are illustrated in FIG. 6B). Copper, iron, nickel, aluminum or other metals or metal alloys may be used as materials for the electrically conductive layer 51.

The electrically conductive layer 51 may be fabricated by using a galvanic deposition method. For that, a seed layer is first deposited onto the top surface of the substrate 50. The seed layer usually has a thickness of some hundred nanometers. Materials such as palladium or titanium may be used for the seed layer.

The thickness of the seed layer may be increased by depositing a further layer of an electrically conductive material onto the seed layer. For example, a layer of copper may be electroless deposited onto the seed layer. This copper layer may have a thickness of less than 1 µm. Afterwards another layer of copper may be galvanically deposited, which may have a thickness of more than 10 µm. The electroless copper deposition may also be omitted. The electrically conductive layer 51 may be structured after the completed deposition process of all its layers or after the deposition of the seed layer.

In one embodiment, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 10 µm.

As further alternatives, other deposition methods, such as physical vapor deposition, chemical vapor deposition, spin-on processes, spray deposition or ink jet printing may also be used. Furthermore, the electrically conductive layer 51 may be a metal film, for example a copper film, which is laminated onto the top surface of the substrate 50. Vacuum, heat and pressure may be applied for a time suitable to attach the electrically conductive layer 51 to the substrate 50.

Two power semiconductor chips 15 as well as possibly further semiconductor chips are placed over the electrically conductive layer 51 (see FIG. 6C). For example, on each pad of the electrically conductive layer 51 a single power semiconductor chip 15 is mounted. The power semiconductor chips 15 as well as all other semiconductor chips described herein may have been fabricated on a wafer made of semiconductor material. After dicing the wafer and thereby separating the individual power semiconductor chips 15, the power semiconductor chips 15 are relocated on the substrate 50 in larger spacings as they have been in the wafer bond. The power semiconductor chips 15 may have been manufactured on the same wafer, but may in one embodiment have been manufactured on different wafers. Furthermore, the power semiconductor chips 15 may be physically identical, but may also contain different integrated circuits.

The power semiconductor chip 15 may, for example, be a power diode or a power transistor, such as a power MOSFET, an IGBT, a JFET or a power bipolar transistor. In case of power MOSFETs, the power semiconductor chips 15 may be mounted on the electrically conductive layer 51 with their drain electrodes 30 facing the electrically conductive layer 51.

The electrical connections between the drain electrodes 30 of the power semiconductor chips 15 and the electrically conductive layer 51 may, for example, be produced by reflow soldering, vacuum soldering, diffusion soldering or adhesive bonding by using an electrically conductive adhesive.

An electrically insulating material 16 is deposited on the power semiconductor chips 15 and the exposed parts of the electrically conductive layer 51 and the substrate 50 (see FIG. 6D). The electrically insulating material 16 may be laminated as a foil or sheet onto the underlying structures by applying vacuum as well as heat and pressure for a suitable time. It may also be provided that the electrically insulating material 16 is deposited from a solution or a gas phase and may be built-up in a layer-by-layer fashion to a desired thickness. Techniques that can be employed for this kind of deposition are, for example, physical or chemical vapor deposition, spinning, dispensing, dipping, injection molding, compression molding, powder molding or liquid molding. The electrically insulating material 16 may be fabricated from a polymer, such as parylene, a photoresist material, a silicone, a mold material or an inorganic, ceramic-like material, such as silicone-carbon compounds.

The electrically insulating material 16 may be structured as illustrated in FIG. 6E. A plurality of cutouts or through-holes 52 may be created in the electrically insulating material 16 to expose at least portions of the source electrodes 32 and the gate electrodes 34 (not illustrated) of the power semiconductor chips 15 as well as portions of the upper surfaces of the pads of the electrically conductive layer 51 so that electrical connections can be made to those exposed regions. The electrically insulating material 16 may, for example, be structured by a stamping process, laser ablation, etching, photo-lithographic structuring or any other suitable process known to a person skilled in the art.

In an embodiment, which is not illustrated in the Figures, the electrically insulating material 16 is provided as a polymer foil or sheet with a plurality of cutouts or through-holes 52 before it is laminated onto the electrically conductive layer 51. The cutouts or through-holes 52 may be provided by stamping out regions of the polymer foil or sheet. The size and arrangement of these regions correspond to the size and arrangement of the surfaces of the elements, which are desired to be exposed.

The cutouts or through-holes 52 produced in the electrically insulating material 16 may be filled with an electrically conductive material in order to form through-connections 53 in the electrically insulating material 16 (see FIG. 6F). The electrically conductive material may be a metal, such as copper or aluminum, or a metal alloy, such as SnAg or SnAu. The through-connections 53 may be produced by employing the same or similar methods as described above in connection with the production of the electrically conductive layer 51.

The electrically insulating material 16 acts as a platform for the deposition of an electrically conductive layer 54 (see FIG. 6G). The electrically conductive layer 54 may be deposited using the same or similar methods and materials as presented above for the deposition of the electrically conductive layer 51, for example plating processes. The electrically conductive layer 54 may have a thickness of more than 10 µm. The electrically conductive layer 54 may be structured to electrically couple each of the source electrodes 32 and the gate electrodes 34 to one of the through-connections 53 (see FIG. 6G).

A dielectric layer 55 may be deposited on top of the electrically conductive layer 54 (see FIG. 6H). The dielectric layer 55 may be fabricated in various ways. For example, the dielectric layer 55 can be deposited from a gas phase or from a solution, or can be laminated onto the underlying structures. Furthermore, thin-film technology methods or a standard PCB industry process flow can be used for application of the dielectric layer 55.

The two power semiconductor chips 15 are separated from one another by separation of the substrate 50 and the electrically insulating material 16 and 55, for example by sawing, a laser beam or etching (see FIG. 6I).

One of the devices 600 is illustrated in FIG. 6J in side view (top) and top view (bottom). The devices 600 have been singulated such that parts of the through-connections 53 which are electrically coupled to the drain, source and gate electrodes 30, 32 and 34 are exposed. The drain electrode 30 is electrically coupled via the electrically conductive layer 51 to one of the through-connections 53 which is exposed at the side face 19. Furthermore, a part of the electrically conductive layer 51 is also exposed at the side face 19. The height $h_1$ of the through-connection 53 and the electrically conductive layer 54 exposed at the side face 19 is at least 30, 40, 50, 60, 70, 80 or 90% of the height $h_2$ of the device 600 which is the distance between the first plane 14 and the second plane 17. This exposed surface is the external contact element of the drain electrode 30.

Each of the source and gate electrodes 32 and 34 are electrically coupled via the electrically conductive layer 54 to one of the through-connections 53 which are exposed at the side face 18. Furthermore, parts of the electrically conductive layer 54 are also exposed at the side face 18. The height $h_5$ of one of the through-connections 53 and the electrically conductive layer 51 exposed at the side face 18 is at least 30, 40, 50, 60, 70, 80 or 90% of the height $h_2$ of the device 600. These exposed surfaces are the external contact elements of the source and gate electrodes 32 and 34.

It may be provided that the distance $h_3$ between the side faces 18 and 19 is greater than the distance $h_4$ between the side faces 37 and 38. This means that the external contact elements of the drain electrode 30 and the source electrode 32, which are exposed at the side faces 18 and 19, have the maximum possible distance within the device 600. During operation of the device 600, voltages higher than 50, 100, 500 or 1000 V may be applied between the drain and source electrodes 30 and 32. The large distance between the external contact elements of the drain electrode 30 and the source electrode 32 reduces creepage currents between these electrodes and may increase electrical strength of the device 600.

The devices 300, 400 and 600 described above include power semiconductor chips 15 of vertical type. In FIGS. 7A to 7F, 8 and 9A to 9H methods for production of devices 700, 800 and 900 are schematically illustrated which include power semiconductor chips 15 of lateral type. These power semiconductor chips 15 are fabricated in such a way that electric currents can flow in a direction substantially parallel to the main surfaces of the power semiconductor chips 15. In a power semiconductor chip 15 having a lateral structure, the electrodes through which the current is conducted are arranged on only one main surface of the power semiconductor chip 15. The devices 700, 800 and 900 are implementations of the devices 100 and 200 illustrated in FIGS. 1 and 2. The details of the devices 700, 800 and 900 that are described below can therefore be likewise applied to the devices 100 and 200.

Figure 7A:
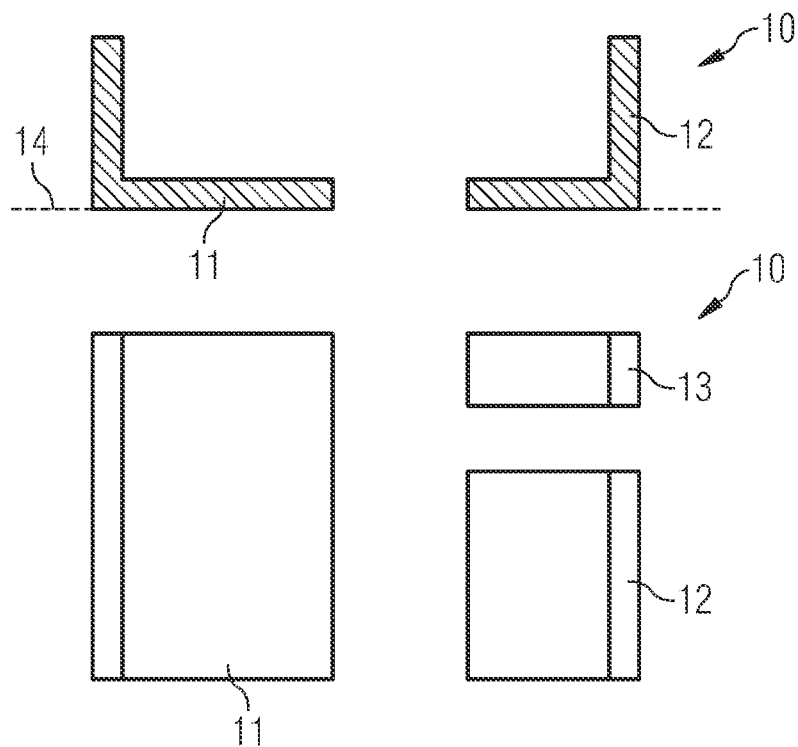

In FIGS. 7A to 7F different stages of the fabrication of a device 700 are exemplarily illustrated. In order to manufacture the device 700, first a leadframe 10 is provided including a carrier 11 and contact elements 12 and 13 as illustrated in FIG. 7A in side view (top) and top view (bottom). The leadframe 10 of FIG. 7A is similar to the leadframe 10 of FIG. 3A.

Figure 7B:
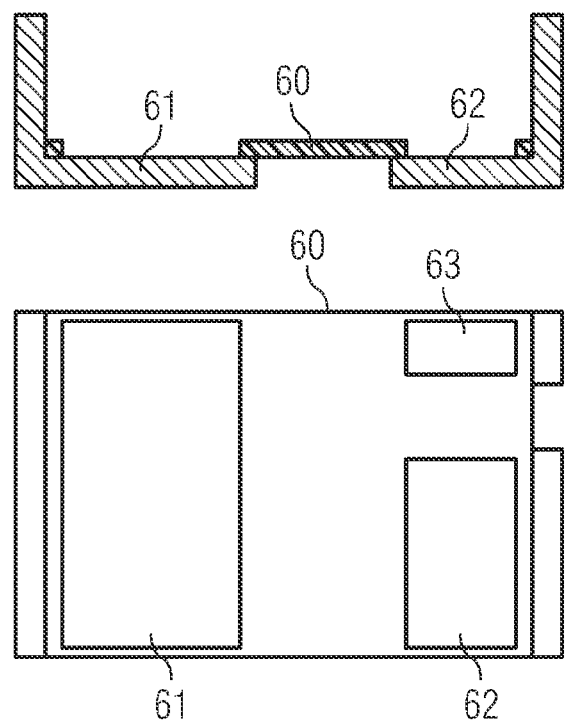

The upper surface of the carrier 11 and portions of the contact elements 12 and 13 form a plane on which an electrically insulating foil 60 is deposited to bridge the gaps between the carrier 11 and the contact elements 12 and 13 and to act as a platform for the deposition of further layers (see FIG. 7B). The electrically insulating foil 60 may, for example, be laminated onto the carrier 11 and the contact elements 12 and 13 and may be structured as illustrated in FIG. 7B by a stamping process, etching, laser ablation or any other suitable process known to a person skilled in the art. The electrically insulating foil 60 may be manufactured from a plastic or synthetic material or any other suitable material. The structuring process may create through-holes 61, 62 and 63 in the electrically insulating foil 60 in order to electrically couple the drain, source and gate electrodes 30, 32 and 34 of the power semiconductor chip 15 later on to the carrier 10 and the contact elements 12 and 13, respectively.

The through-holes 61 to 63 generated in the electrically insulating foil 60 may be filled with a metal or a metal alloy layer 64 (see FIG. 7C). Then a dielectric layer 65, for example a silicon nitride or photoresist layer, may be deposited on the electrically insulating foil 60 and may be structured. The through-holes in the dielectric layer 65 may be filled with a metal or a metal alloy layer 66 (see FIG. 7D). The layers 64 and 66 may be generated by electroless and/or galvanic plating processes. In one embodiment, other deposition methods, such as physical vapor deposition, chemical vapor deposition, sputtering, spin-on processes, spray depositing or ink jet printing may also be used. Copper, iron, nickel or other metals or metal alloys may be used as material. The thickness of each of the layers 64 and 66 may be in the range from 10 μm to 1 mm, in one embodiment in the range from 50 μm to 150 μm.

The power semiconductor chip 15 is mounted onto the layer 66 with its drain, source and gate electrodes 30, 32 and 34 facing the layer 66 (see FIG. 7E, the gate electrode 34 is not illustrated in FIG. 7E). The electrical connections between the electrodes 30, 32 and 34 of the power semiconductor chip 15 and the layer 66 may, for example, be produced by reflow soldering, vacuum soldering, diffusion soldering or adhesive bonding by using an electrically conductive adhesive.

A mold material 16 may be used to encapsulate the device 700 (see FIG. 7F). The mold material 16 may encapsulate any portion of the device 700, but leaves the outer surfaces of the carrier 11 and the contact elements 12 and 13 uncovered. The mold material 16 may be composed of any appropriate thermoplastic or thermosetting material, in one embodiment it may be composed of material commonly used in contemporary semiconductor packaging technology.

Like the device 300, heights $h_1$ of the carrier 11 and the contact elements 12 and 13 of the device 700 are longer than 30, 40, 50, 60, 70, 80 or 90% of the height $h_2$ of the device 700.

The device 800 illustrated in FIG. 8 is a variation of the device 700. In the device 800 the bottom faces of the carrier 11 and the contact elements 12 and 13 are not completely planar, but they exhibit recesses in certain areas. Only in areas adjacent to the side faces 18 and 19, the bottom faces of the carrier 11 and the contact elements 12 and 13 lie in the first plane 14. The recesses in the bottom face of the leadframe 10 may have been formed by milling, stamping, etching or any other appropriate technique. The recesses may have been filled with the mold material 16.

In FIGS. 9A to 9H different stages of the fabrication of a device 900 are schematically illustrated. The fabrication method illustrated in FIGS. 9A to 9H is a variation of the fabrication method illustrated in FIGS. 7A to 7F. In contrast to the method of FIGS. 7A to 7F, in the present embodiment a leadframe 10 is provided including a carrier 11 and contact elements 12 and 13 which may have essentially coplanar top and bottom surfaces (see FIG. 9A).

The processes illustrated in FIGS. 9B to 9F are essentially identical to the processes illustrated in FIGS. 7B to 7F.

Figure 9A:
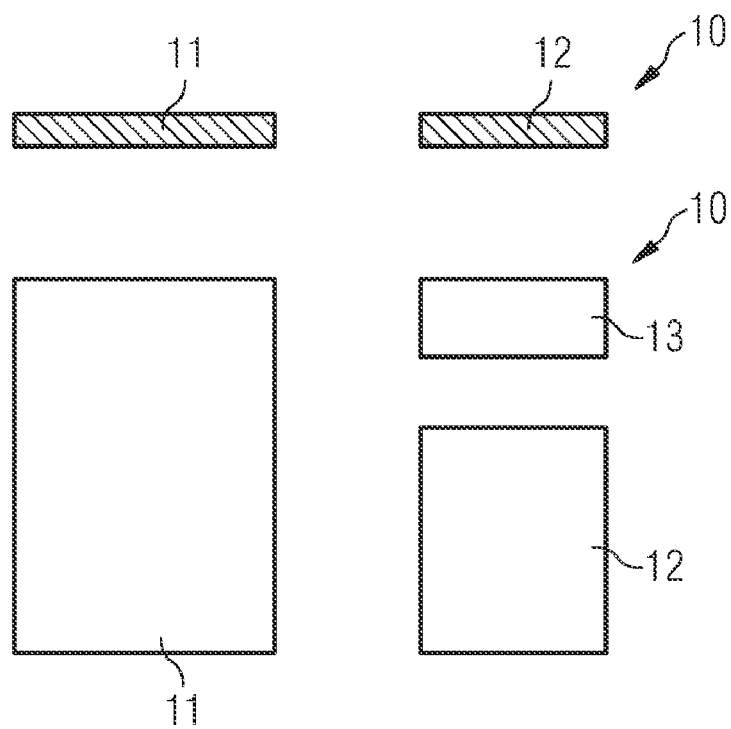
Figure 9B:
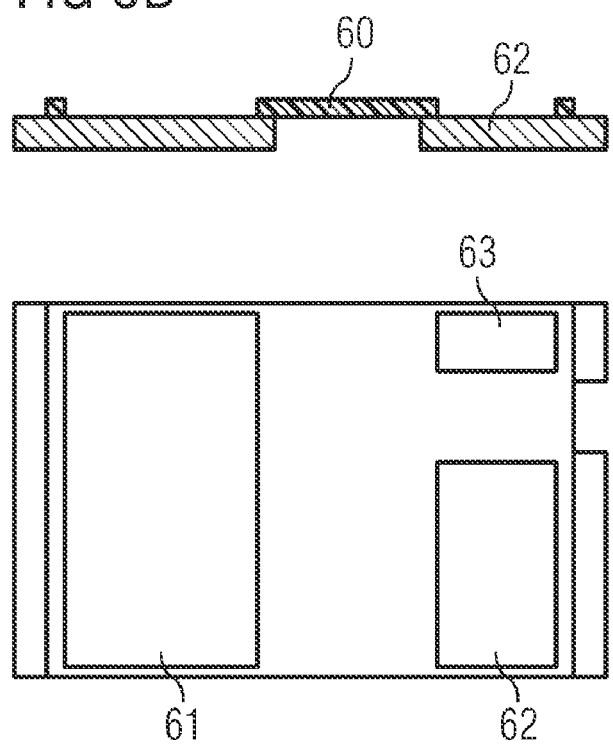
Figure 9F:
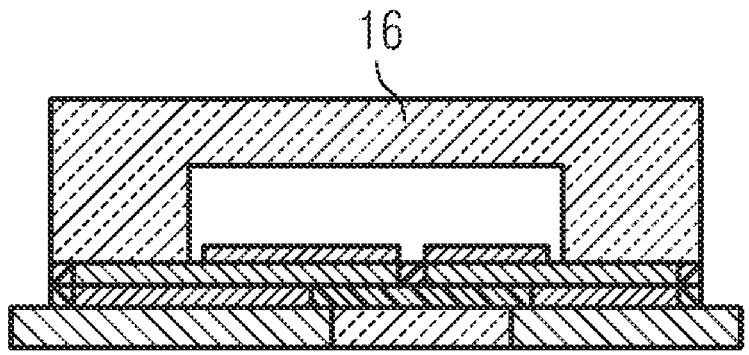
Figure 9G:
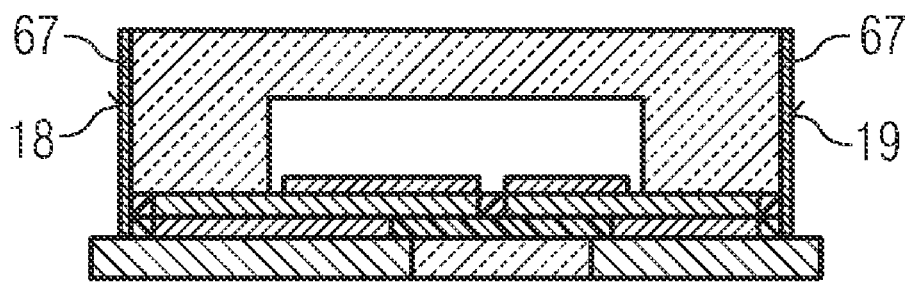

After the encapsulation of the device 900 with the mold material 16, the side faces 18 and 19 may be covered with electrically conductive seed layers 67 (see FIG. 9G). An electroless deposition method may be used to produce the seed layers 67. The seed layers 67 may have a thickness of up to 1 µm.

The electrical conductivity of the seed layers 67 may be used to galvanically deposit electrically conductive layers 68 on the seed layers 67. The electrically conductive layers 68 may, for example, consist of copper and may have a thickness of up to 100 µm and in one embodiment in the range between 1 µm and 10 µm.

Figure 9H:
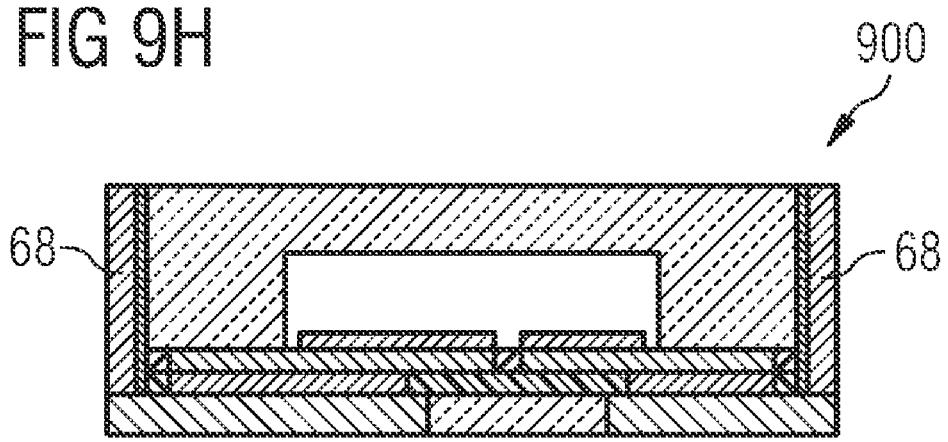

In the embodiment illustrated in FIG. 9H the heights of the external contact elements coupled to the drain, source and gate electrodes 30, 32 and 34 are equal to the height of the device 900.

Figure 10:
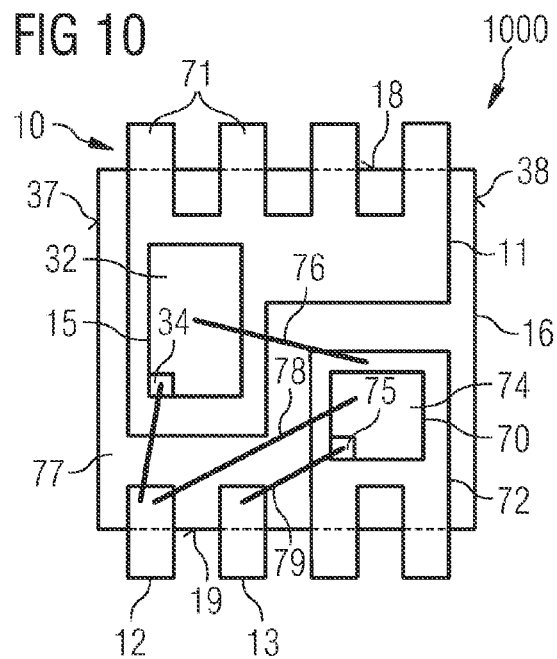
FIG. 10 schematically illustrates one embodiment of a device.

FIG. 10 schematically illustrates a device 1000 including a leadframe 10, a first power semiconductor chip 15 and a second power semiconductor chip 70. The leadframe 10 may be made of a metal or metal alloy, for example copper, and consists of a first carrier 11 being integral with contact elements 71, a second carrier 72 and contact elements 12 and 13. The first power semiconductor chip 15 may be a JFET integrated in a SiC (silicon carbide) substrate. The first power semiconductor chip 15 may be mounted on the first carrier 11 with its drain electrode 30 facing the first carrier 11 and its source and gate electrodes 32 and 34 facing away from the first carrier 11. The second power semiconductor chip 70 may be a power MOSFET integrated in a silicon substrate or any other semiconductor substrate. The power MOSFET 70 may, for example, have a breakdown voltage of about 30 V. The second power semiconductor chip 70 may be mounted on the second carrier 11 with its drain electrode 73 (not illustrated in FIG. 10) facing the second carrier 72 and its source and gate electrodes 74 and 75 facing away from the second carrier 72.

A bond wire 76 may electrically couple the source electrode 32 of the first power semiconductor chip 15 to the second carrier 72. A bond wire 77 may electrically couple the gate electrode 34 of the first power semiconductor chip 15 to the contact element 12. A bond wire 78 may electrically couple the source electrode 74 of the second power semiconductor chip 70 to the contact element 12. A bond wire 79 may electrically couple the gate electrode 75 to the contact element 13. The device 1000 may be encapsulated by a mold material 16. The mold material 16 leaves at least parts of the contact elements 12, 13 and 71 exposed. As illustrated in FIG. 10, the contact elements 71 may be arranged on a side face 18 of the device 1000 and the contact elements 12 and 13 may be arranged on a side face 19 of the device 1000 opposite to the side face 18. The distance between the side faces 18 and 19 may be larger than the distance between the side faces 37 and 38 of the device 1000.

Figure 11:
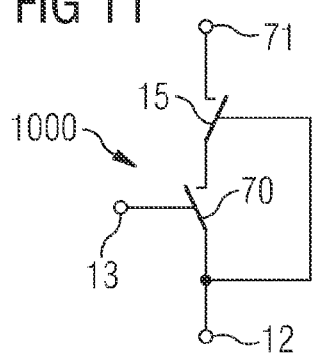
FIG. 11 illustrates one embodiment of a circuit diagram of the device.

In FIG. 11 a circuit diagram of the device 1000 is illustrated. The second power semiconductor chip 70 is coupled in a cascode circuit to the first power semiconductor chip 15. If the first power semiconductor chip 15 is a JFET embedded in a SiC substrate and if the JFET 15 is operated alone, the JFET 15 is a "normally on" component, which means that the drain-source path of the JFET 15 is conductive if a high voltage is applied to its drain electrode 30 and a lower voltage, such as ground, is applied to its source electrode 32. Due to the cascode circuit, the JFET 15 becomes a "normally off" component. In this case, it depends on the voltage applied to the contact element 13 whether both power semiconductor chips 15 and 70 are turned on or off.

During operation of the device 1000, voltages in the range between 0.5 and 1.5 kV or higher may be applied between the contact elements 71 and 12. Since the contact elements 71 and 12 are arranged on opposite side faces 18 and 19 of the device 1000, this arrangement may reduce creepage currents between the contact elements 71 and 12. Since the voltage difference between the contact elements 12 and 13 is usually much lower than the voltage between the contact elements 71 and 12, the contact elements 12 and 13 may be arranged on the same side face 19 of the device 1000.

Figure 12:
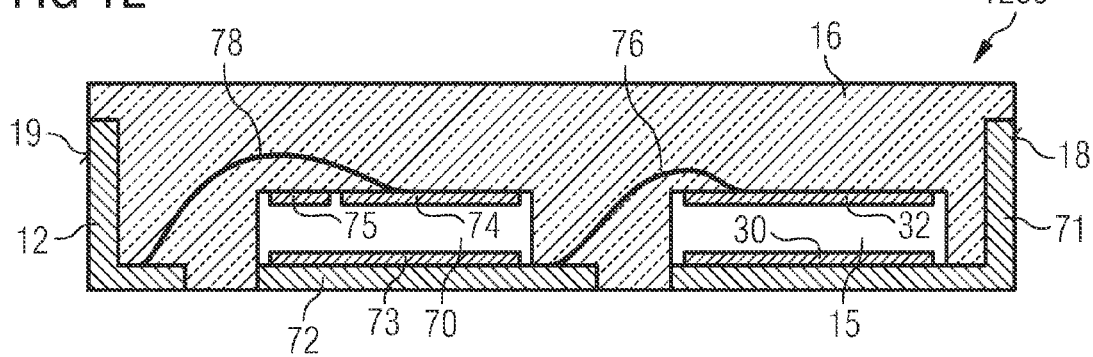
FIG. 12 schematically illustrates one embodiment of a device.

The device 1000 may, for example, be produced by using one of the methods illustrated in FIGS. 3A to 3D and 6A to 6J. When the method of FIGS. 3A to 3D is used, a device 1200 is obtained which is illustrated in FIG. 12 (the gate electrode 34, the contact element 13 and the bond wires 77 and 79 are not illustrated in FIG. 12).

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A device, comprising:
a carrier defining a first plane;
a power semiconductor chip attached to the carrier;
multiple contact elements disposed adjacent to the carrier, wherein at least one of the multiple contact elements is electrically coupled to the power semiconductor chip, and
a body formed of an electrically insulating material covering the power semiconductor chip and the multiple contact elements, the body defining a second plane parallel to the first plane and side faces extending from the first plane to the second plane, the body covering the multiple contact elements at the second plane,
wherein at least one of the multiple contact elements has a cross section in a direction orthogonal to the first plane that is longer than 60% and less than 100% of the distance between the first plane and the second plane, and
wherein a portion of the at least one of the multiple contact elements extending orthogonally from the first plane toward the second plane directly contacts the body and has an exposed surface aligned with an exposed side face of the body and the surface is adapted to be covered with a solder material.

2. The device of claim 1, wherein the power semiconductor chip comprises a first electrode which is attached to the carrier.

3. The device of claim 2, comprising wherein the first electrode is arranged on a first main surface of the power semiconductor chip and the second electrode is arranged on a second main surface of the power semiconductor chip opposite to the first main surface.

4. The device of claim 1, comprising wherein the carrier is electrically coupled to a first contact element of the multiple contact elements.

5. The device of claim 4, comprising wherein the carrier is integral with the first contact element.

6. The device of claim 1, wherein the power semiconductor chip comprises a second electrode which is electrically coupled to a second contact element of the multiple contact elements.

7. The device of claim 1, wherein the power semiconductor chip comprises a third electrode which is electrically coupled to a third contact element of the multiple contact elements.

8. The device of claim 7, comprising wherein the first contact element is exposed at a first side face of the side faces and the second and third contact elements are exposed at a second side face of the side faces opposite to the first side face.

9. The device of claim 8, comprising wherein the distance between the first side face and the second side face is larger than the distance between a third side face of the side faces and a fourth side face of the side faces opposite to the third side face.

10. The device of claim 1, comprising wherein the power semiconductor chip is a power transistor.

11. The device of claim 1, wherein the power semiconductor chip comprises a SiC crystal.

12. The device of claim 1, wherein the device comprises a further semiconductor chip coupled in a cascode circuit to the power semiconductor chip.

13. The device of claim 1, wherein a surface of the carrier, a surface of the at least one of the multiple contact elements, and a surface of the body define the first plane.

14. The device of claim 1, wherein the body is adapted to be adhesively attached to a circuit board.

15. The device of claim 1, wherein the exposed surface of the at least one of the multiple contact elements is adapted to be covered with the solder material by wave soldering.

16. A system, comprising:
a device comprising:
  a carrier and multiple contact elements, the carrier defining a first plane;
  a power semiconductor chip attached to the carrier; and
  a body formed of an electrically insulating material covering the power semiconductor chip, the body defining a second plane parallel to the first plane and side faces extending from the first plane to the second plane,
  wherein at least one of the multiple contact elements has a cross section in a direction orthogonal to the first plane that is longer than 60% and less than 100% of the distance between the first plane and the second plane, wherein a portion of the at least one of the multiple contact elements extending orthogonally from the first plane toward the second plane directly contacts the body and has an exposed surface aligned with an exposed side face of the body and the exposed surface is adapted to be covered with a solder material, and wherein the body covers the multiple contact elements at the second plane;
a circuit board; and
solder material,
wherein the device is mounted on the circuit board and the solder material electrically couples the exposed surface of the at least one of the multiple contact elements to the circuit board.

* * * * *